# (12) United States Patent
Joo

(10) Patent No.: US 6,544,861 B2
(45) Date of Patent: Apr. 8, 2003

(54) METHOD FOR FORMING ISOLATION TRENCH

(75) Inventor: Joon-Yong Joo, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/118,671

(22) Filed: Apr. 8, 2002

(65) Prior Publication Data

US 2002/0146891 A1 Oct. 10, 2002

(30) Foreign Application Priority Data

Apr. 10, 2001 (KR) .................................. 2001-18967

(51) Int. Cl.$^7$ ........................ H01L 21/336; H01L 21/76
(52) U.S. Cl. ........................ 438/424; 438/435; 438/296
(58) Field of Search ............................... 438/424, 425, 438/296, 404, 435

(56) References Cited

U.S. PATENT DOCUMENTS

| 5,447,884 A | 9/1995 | Fahey et al. | |
|---|---|---|---|
| 6,180,493 B1 | * 1/2001 | Chu | 438/424 |
| 6,207,494 B1 | * 3/2001 | Graimann et al. | 438/248 |
| 6,251,735 B1 | * 6/2001 | Lou | 438/424 |
| 6,297,127 B1 | * 10/2001 | Chen et al. | 438/424 |

\* cited by examiner

*Primary Examiner*—John F. Niebling
*Assistant Examiner*—Ron Pompey
(74) *Attorney, Agent, or Firm*—Marger Johnson & McCollom P.C.

(57) ABSTRACT

A method for forming an isolation trench in a semiconductor substrate is provided. An isolation trench is formed in a semiconductor substrate using a trench etch mask pattern. Sidewall spacers are formed on the sidewalls of the trench. A nitride liner is formed over the sidewall spacers. The trench is filled with a trench isolation material. Because the nitride liner is protected, for example, by the sidewall spacers, the formation of a dent in the nitride liner can be prevented.

21 Claims, 8 Drawing Sheets

METHOD FOR FORMING ISOLATION TRENCH

RELATED APPLICATION

This application claims priority from Korean Patent Application No. 2001-18967, filed on Apr. 10, 2001, the contents of which are incorporated herein by reference in their entirety.

FIELD OF THE INVENTION

The present invention relates to a method for fabricating a semiconductor device and, more particularly, to a method for forming a dent-free isolation trench.

BACKGROUND OF THE INVENTION

A technique for isolating devices formed on a semiconductor substrate has a direct effect on device reliability and basic transistor characteristics. Thus, effective device isolation techniques are important in the development of devices. Inadequate device isolation causes leakage current and results in a loss of a power supplied to a semiconductor chip. Inadequate isolation also increases the occurrence of latch-up and causes temporary or permanent damage to the functions of semiconductor devices. It can also lead to degradation of a noise margin, voltage shift, and/or crosstalk.

In a conventional method for isolating a device region of the semiconductor substrate, a local oxidation of silicon (hereinafter referred to as "LOCOS") method has been used. In this method, a patterned silicon nitride layer and a pad oxide layer are used to mask a silicon substrate to define an active region therein. The pad oxide layer is used to alleviate a stress caused by the silicon nitride layer. Impurities are implanted into the exposed silicon substrate, and a thick field oxide layer is then locally formed to form a LOCOS structure.

The conventional LOCOS structure has several problems, however, such as so-called "bird's beak encroachment." Bird's beak encroachment is a lateral extension of the field oxide into the active area of semiconductor devices caused by some of the oxidant diffusing under the edges of the silicon nitride masking layer. Also, during field oxidation, channel stop dopants can laterally diffuse into the active device region, leading to a narrower channel width than desired.

To deal with these problems, a shallow isolation trench is now widely used. In the shallow trench isolation technique, a semiconductor substrate is etched using a trench etch mask to form a trench. The trench is then filled with a chemical vapor deposition (CVD) layer to provide a device isolation layer. Next, the CVD layer is planarized and the trench etch mask is removed.

According to this trench isolation technique, a stress generated by a device isolation material filled in the trench is applied to the sidewalls of the trench, forming a shallow pit therein, or in the active regions. The presence of a pit results in an increase in leakage current in the active device regions and also degrades the insulation characteristics of the isolation trench. The stress can be caused, for example, by a thermal stress generated during depositing or annealing of the CVD layer. A stress can be also caused by the volume expansion resulting from oxygen diffusion during the deposition of the CVD layer.

In order to prevent such stresses, a technique for forming a thermal oxide layer on the sidewalls of a trench and depositing a liner layer of a nitride layer on the thermal oxide layer has been introduced In U.S. Pat. No. 5,447,884 (the '884 patent), for example, a method of forming a nitride liner to provide trench isolation is disclosed. In U.S. Pat. No. 4,631,403, two kinds of oxidation barriers are disclosed—one being a dual layer of oxide-nitride, and the other being a triple layer of oxide-nitride-oxide.

FIGS. 1 and 2 are cross-sectional views of a semiconductor substrate illustrating a conventional method of forming trench isolation using a nitride liner. Referring to FIG. 1, a thermal oxide layer 20 is formed on a semiconductor substrate 10, and a mask nitride layer 14 is formed thereon. These layers are patterned to form a trench etch mask. The semiconductor substrate 10 is etched using the trench etch mask to form a trench therein. A thermal oxidation process is then performed to form a thermal oxide layer in the trench, and a nitride liner 26 is formed on the thermal oxide layer 20. A trench isolation 20 material 28 is next deposited to fill the trench, and then planarized until the top of the mask nitride layer 14 is exposed.

Referring to FIG. 2, an isotropic wet etching process is performed using phosphoric acid on an entire surface of planarized substrate to remove the mask nitride layer 14. Unfortunately, because the nitride liner 26 is adjacent to the mask nitride layer, a portion of the nitride liner 26 is also etched during this process. In other words, a phosphoric acid solution penetrates into the trench along the nitride liner 26, and a dent is created in the nitride liner 26 (refer to a circle marked with a dotted line). The size of the dent in the nitride liner 26 increases during subsequent processing steps including a fluoric acid etch process and a cleaning process. This results in large voids being created in the trench. A stringer can be undesirably created in subsequent gate pattern formation steps, forming a bridge between the adjacent storage nodes and degrading the refresh characteristics.

SUMMARY OF THE INVENTION

According to an embodiment of the present invention, a method for forming an isolation trench is provided to prevent a dent in a nitride liner within the trench.

The method in accordance with an embodiment of the present invention includes forming spacers on the sidewalls of a mask nitride layer and a trench after forming a trench in a semiconductor substrate, and before forming a nitride liner. A thermal oxidation process can be performed after forming the trench and before forming the nitride liner. Preferably, a thermal oxidation process is performed after forming the sidewall spacers and before forming the nitride liner, and at this time, a thermal oxidation process can be further performed after forming the trench.

More specifically, according to an embodiment of the present invention, a trench etch mask pattern including a pad oxide layer 20 and a mask nitride layer is formed on a semiconductor substrate to define an active region. The semiconductor substrate is etched using the mask pattern to form a trench therein. A spacer insulation layer is formed on the resulting structure where the trench is formed. The spacer insulation layer is anisotropically etched to form sidewall spacers on the sidewalls of the mask pattern and the trench. A thermal oxidation process is performed to repair the etch damage resulting from etching the trench and the spacer insulation layer. A nitride liner is formed on the resulting structure where thermal oxidation process is performed. A trench isolation material is formed on the nitride liner to fill the trench. The trench isolation material is planarized until the top of the mask nitride layer is exposed. The mask nitride layer is removed.

In one embodiment, thermal oxidation process can be further performed after forming the trench or after forming the spacer insulation layer.

In another embodiment, the spacer insulation layer is formed of a material having an etch selectivity with respect to the mask nitride layer. It is more preferable that the spacer insulation layer be formed of silicon oxide to a thickness of 50 Å to 1,000 Å by a chemical vapor deposition (CVD) technique.

In yet another embodiment, the etch mask pattern is laterally etched to a width of about 200 Å. Consequently, the distance between the top edge of the trench and the mask nitride layer can increase.

A method for forming an isolation trench is provided according to another embodiment of the present invention. The method includes forming a trench etch mask pattern including a pad oxide layer and a mask nitride layer on a semiconductor substrate to define an active region. Also, the semiconductor substrate is etched using the mask pattern to form a trench therein. The mask pattern is etched in the direction of the active region to a width of about 200 Å. A thermal oxidation process is performed to remove the etch damage resulting from the trench etch. A silicon oxide layer is formed on the resulting structure where thermal oxidation process is performed, to a thickness of 50 Å to 100 Å by CVD. The silicon oxide layer is anisotropically etched to form silicon oxide spacers on the sidewalls of the mask pattern and the trench. A nitride liner is formed on the silicon oxide sidewall spacers. The trench is filled with a trench isolation material. The trench isolation material is planarized until the top of the mask nitride layer is exposed. The mask nitride layer is removed.

In one embodiment, through the thermal oxidation process, a thermal oxide layer having a thickness of about 50 Å to 300 Å is formed on the sidewall and the bottom of the trench.

In another embodiment, a thermal oxidation process is performed after forming the silicon oxide sidewall spacers. At this time, a thermal oxide layer can be formed on the silicon.

In accordance with an embodiment of the present invention, the physical distance between the nitride liner at the top edge of the trench and the mask nitride layer increases. Thus, a phosphoric acid solution used to remove the mask nitride layer can be prevented from penetrating into the trench in the subsequent phosphoric acid strip process. Thus, the formation of a dent in the nitride liner can be more effectively prevented.

DESCRIPTION OF THE PREFERRED EMBODIMENT

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

FIGS. 3 through 11 are cross-sectional views showing various stages of the processing steps for forming an isolation trench without problems such as a dent according to one embodiment of the present invention.

Figure 1:
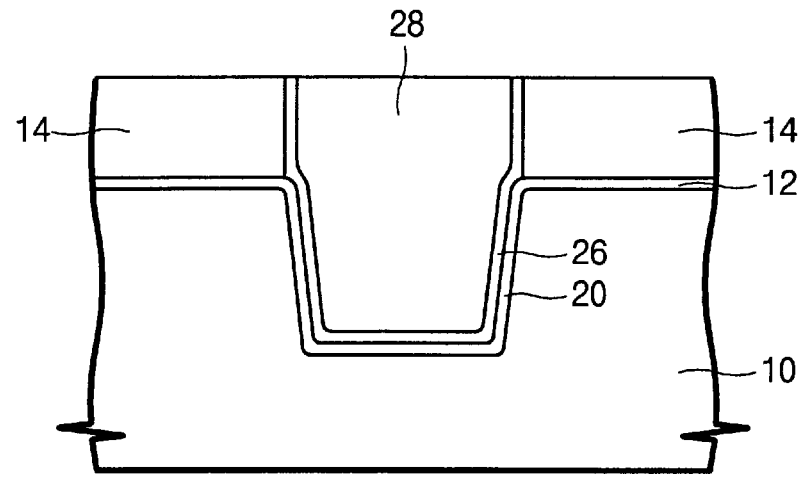
FIGS. 1 and 2 are cross-sectional views to illustrate dent created at a nitride liner according to a conventional method of forming trench isolation.
Figure 2:
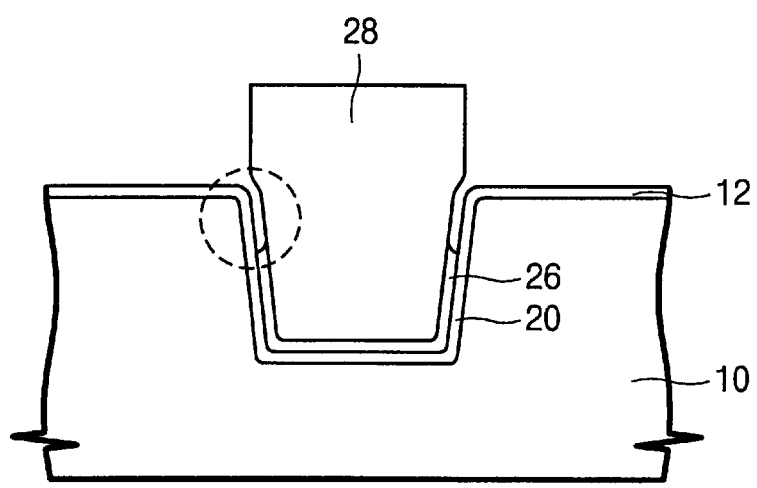
Figure 3:
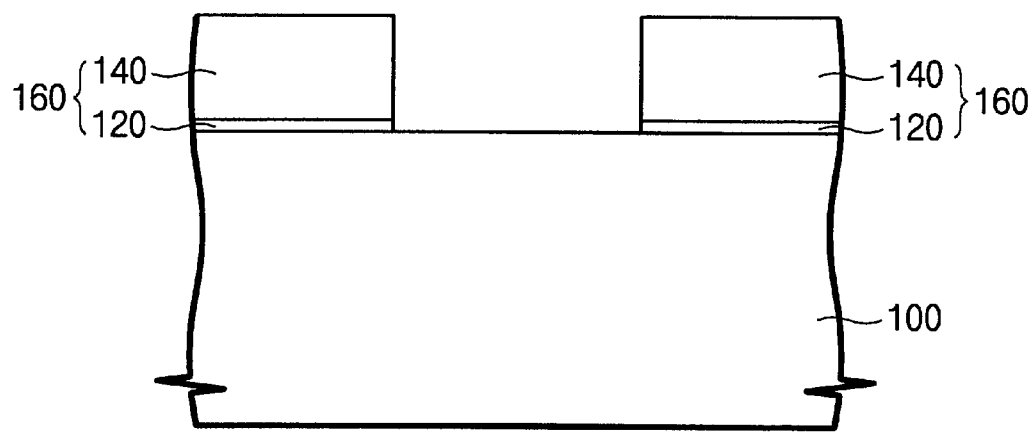
FIGS. 3 through 11 are partial cross-sectional views showing the steps of forming trench isolation according to one embodiment of the present invention.

Referring to FIG. 3, a trench etch mask pattern 160 is formed on a semiconductor substrate 100 to define an active region therein. The trench mask pattern 160 includes, for example, a pad oxide layer 120 and a mask nitride layer 140. The trench etch mask pattern 160 covers a portion of the semiconductor substrate 100 to form a device isolation region therein that defines the active region.

Specifically, an oxide layer for forming the pad oxide layer 120 is formed on the semiconductor substrate 100 by a thermal oxidation process, and a nitride layer for forming the mask nitride layer 140 is formed on the pad oxide layer 120 by conventional techniques such as CVD. The mask nitride layer 140 can be used as a planarization stop layer in a subsequent trench isolation planarization process.

Next, the layers for forming the mask nitride layer 140 and the pad oxide layer 120 are patterned to form the trench etch mask pattern 160 using a photolithographic process.

Figure 4:
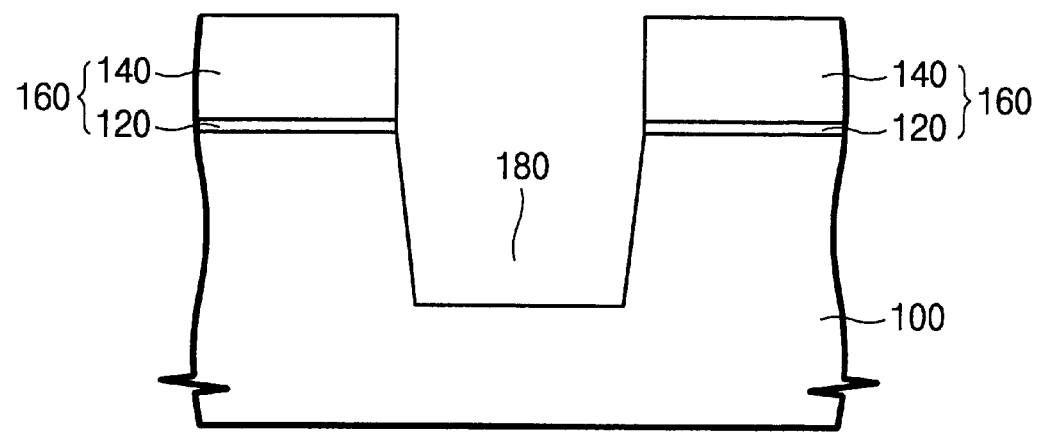

Referring to FIG. 4, the exposed semiconductor substrate 100 is etched to a predetermined depth using the mask pattern 160 as an etch mask to form a trench 180 therein.

Figure 5:
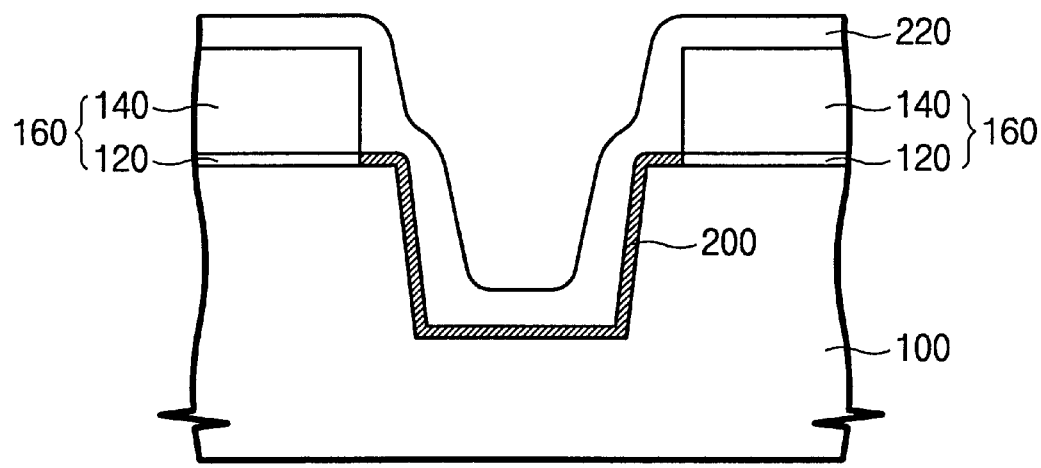

Next, as shown in FIG. 5, the etch mask pattern 160 is etched a predetermined length in the direction of the active region to be formed to expose a region of the semiconductor substrate surface adjacent to the top edge of the trench. For example, the etch mask pattern 160 is etched laterally to a width of about 200 Å. A portion of the exposed semiconductor substrate 100 can also be etched, and the top edge of the trench 180 can be somewhat rounded. It is therefore possible to prevent an electric field from concentrating on the top edge of the trench 180. Also, since the mask nitride layer 140 is spaced apart from the top edge of the trench 180 by the etched distance, the physical distance between a nitride liner to be formed at the top edge of the trench and the mask nitride layer 140 increases. Thus, a phosphoric acid solution used to remove the mask nitride layer 140 can be prevented from penetrating into the trench in the subsequent phosphoric acid strip process. Thus, the formation of a dent in the nitride liner can be more effectively prevented.

After laterally etching a fixed amount of the mask pattern 160 in the direction of the active region, a first thermal oxidation process is performed to form a first thermal oxide layer 200. The first thermal oxidation process cures the etching damage to the substrate 100 during the formation of the trench 180. The first thermal oxide layer 200 is formed to a thickness of 50 Å to 300 Å. Then, a spacer insulation layer 220 having an etch selectivity with respect to the mask nitride layer 140 is formed on the first thermal oxide layer 200. Preferably, the spacer insulation layer 220 is formed of silicon oxide by CVD to a thickness of 50 Å to 1,000 Å. In a subsequent thermal oxidation process, a thermal oxide layer can be further formed on the spacer insulation layer 220. Thus, the physical distance between the mask nitride layer 140 and the nitride liner can be further increased to effectively prevent dent formation. Here, the first thermal oxidation process can be performed after the formation of the spacer insulation layer 220 is completed. In this case, a thermal oxide layer is formed on the bottom and the sidewalls of the trench 180. That is, the thermal oxide layer is formed at the interface between the spacer insulation layer 220 and the semiconductor substrate 100. Even at this time, if the spacer insulation layer 220 is formed of silicon oxide, a thin thermal oxide layer can be formed on the surface of the silicon oxide spacer insulation layer 220.

Figure 6:
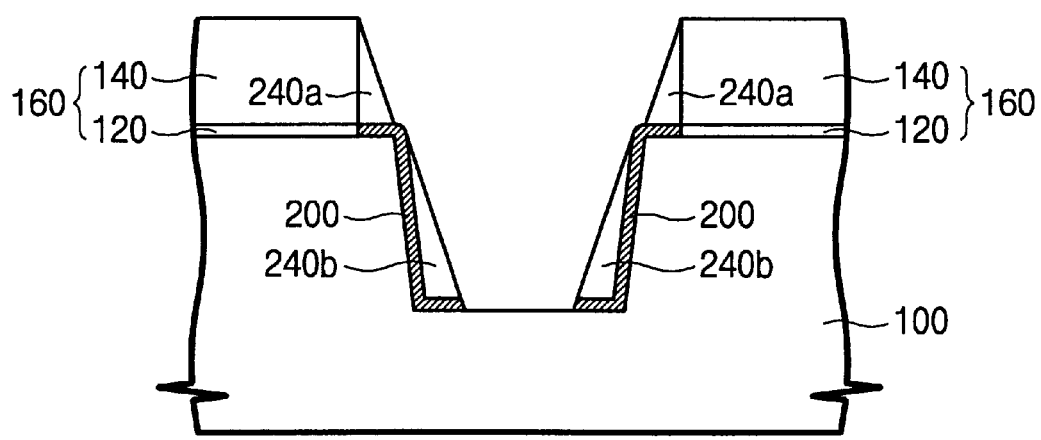

Referring to FIG. 6, the spacer insulation layer 220 is anisotropically etched to form a sidewall spacer 240a on the sidewalls of the mask nitride layer 140 and a sidewall spacer 240b on the sidewalls of the trench 180. The space defined by the trench, where the mask pattern 160 is partially etched in the direction of the active region and the sidewall spacer 240a is formed, is gradually decreased in its size from top to bottom. This can provide a good trench profile to fill the trench without voids when depositing a subsequent trench isolation material.

Figure 7:
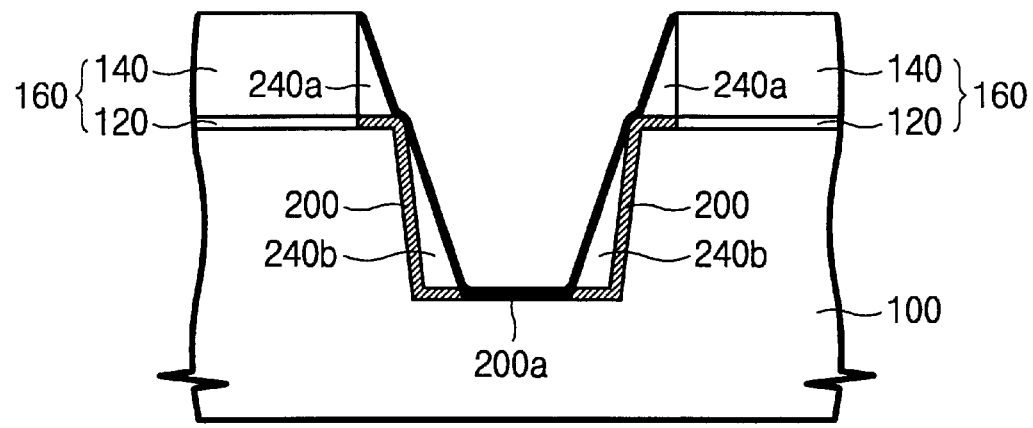

Referring to FIG. 7, a second thermal oxidation process is performed to cure the etch damage resulting from forming the sidewall spacers 240a and 240b and to form a second thermal oxide layer 200a. At this time, if the sidewall spacers 240a and 240b are formed of silicon oxide, the thin second thermal oxide layer 200a can be formed on the surface thereof. If a semiconductor substrate 100 of a trench bottom is exposed during the etch process for forming the sidewall spacers 240a and 240b, a relatively thick thermal oxide layer is formed on the exposed semiconductor substrate. Although not illustrated, a thermal oxide layer can be formed at the interface between the first thermal oxide layer 200 and the semiconductor substrate. If the semiconductor substrate 100 of the trench bottom is not exposed during the formation of the sidewall spacers 240a and 240b, the second thermal oxidation process may be omitted.

The first thermal oxidation process can be omitted according to a process. That is, a thermal oxidation process may not be performed after forming a trench 180 or a spacer insulation layer 220, but may be performed only after forming the sidewall spacers 240a and 240b to cure the etching damage. In this case, a thermal oxide layer is formed on the semiconductor substrate 100 exposed by the spacer and at the interface between the spacer insulation layer and the semiconductor substrate. Also, as described above, a thermal oxide layer can be formed on the spacer insulation layer 220.

If the bottom of the trench 180 formed in the substrate 100 is exposed during the anisotropic etch process for forming the sidewall spacer, the second thermal oxide layer 200a is formed at the bottom of the trench 180 where the semiconductor substrate 100 is exposed, having a thickness greater than at the surface of the sidewall spacers 240a and 240b. Thus, the ratio of vertical length to horizontal width of an empty space defined by the trench can be lowered to increase the deposition characteristic of the subsequent trench isolation material. That is, the sidewall spacer is formed to make the empty space defined by the trench have an inclined profile. Also a thermal oxide layer is formed thicker at the bottom than at the sidewall. The vertical-horizontal ratio is thereby decreased.

Figure 8:
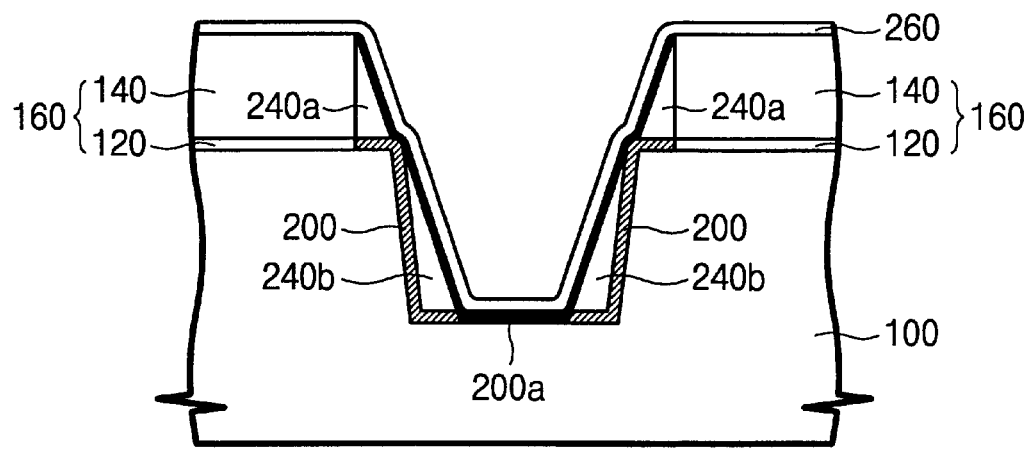

Referring to FIG. 8, a nitride liner 260 at the top edge of the trench is formed on the second thermal oxide layer 200a to a thickness of about 50 Å to 70 Å. As illustrated, the nitride liner 260 at the top edge of the trench is isolated by the sidewall spacer 240a, and the second thermal oxide layer 200a from the mask nitride layer 140.

Figure 9:
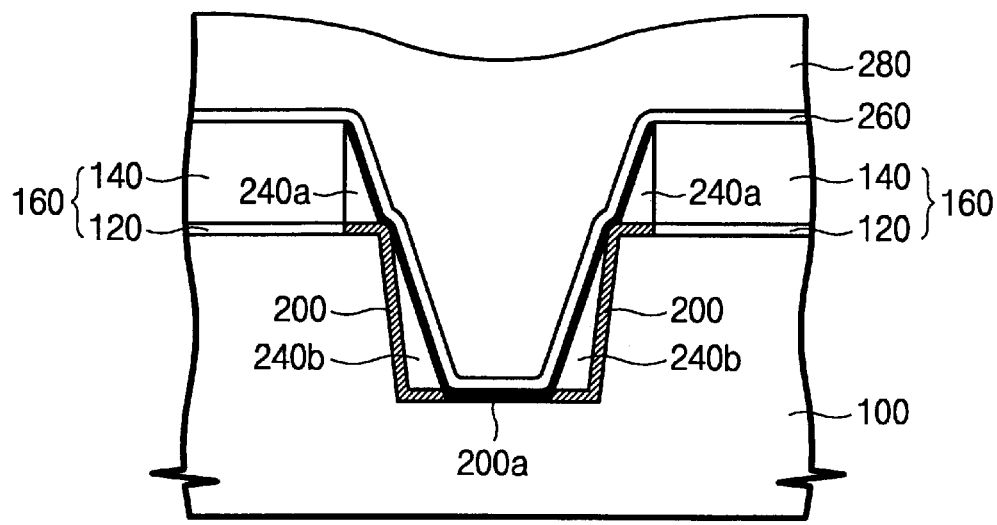

Referring to FIG. 9, a trench isolation material 280 is formed on the nitride liner 260 to fill the trench. For example, the trench isolation material 280 is a high-density plasma (HDP) oxide layer or a boron phosphorus silicate glass (BPSG) layer. In order to densify the trench isolation material 280, a heat treatment process can be further performed.

Figure 10:
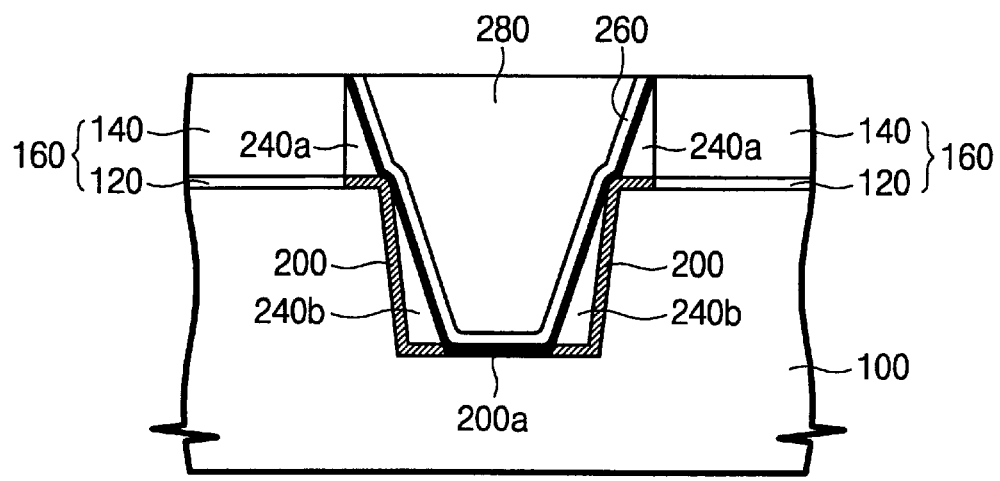

Referring to FIG. 10, a planarization etch process is performed on the trench isolation material 280. At this time, the mask nitride layer 140 can be used as a planarization stop layer.

Figure 11:
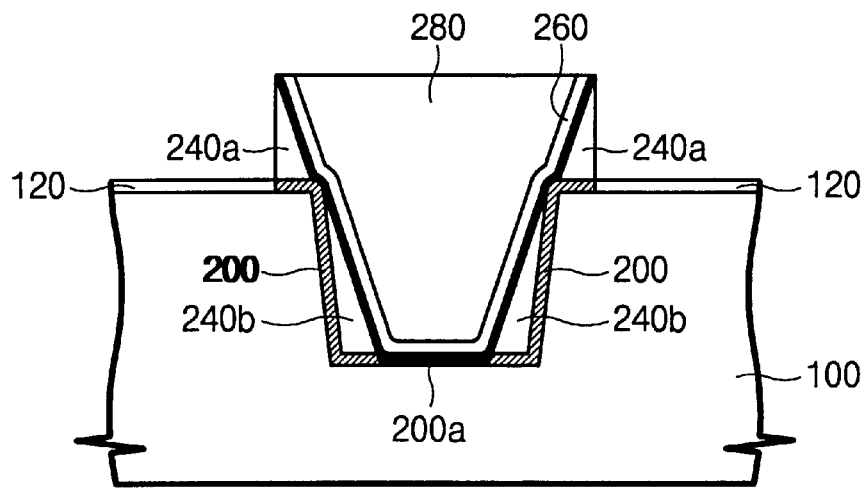

Next, the mask nitride layer 140 is removed using a phosphoric acid solution. As illustrated in FIG. 11, according to an embodiment of the present invention, because the mask nitride layer 140 and the nitride liner 260 are separated from each other by the sidewall spacer 240a and the second thermal oxide layer 200a, it is difficult for the phosphoric acid solution to penetrate into the nitride liner 260 in the trench 180 at the top edge thereof. Thus, as illustrated, it is possible to form an isolation trench without a dent.

Subsequently, a conventional CMOS process is performed.

Referring to FIGS. 12 through 16, another embodiment of the present invention is explained. In this embodiment, the same reference numbers are used with respect to the composition elements having the same functions with the above-mentioned embodiment, and the detail explanation with respect to these are omitted. The main difference with the above-mentioned embodiment is that the etch process is not performed toward the active region with respect to the mask pattern.

Figure 12:
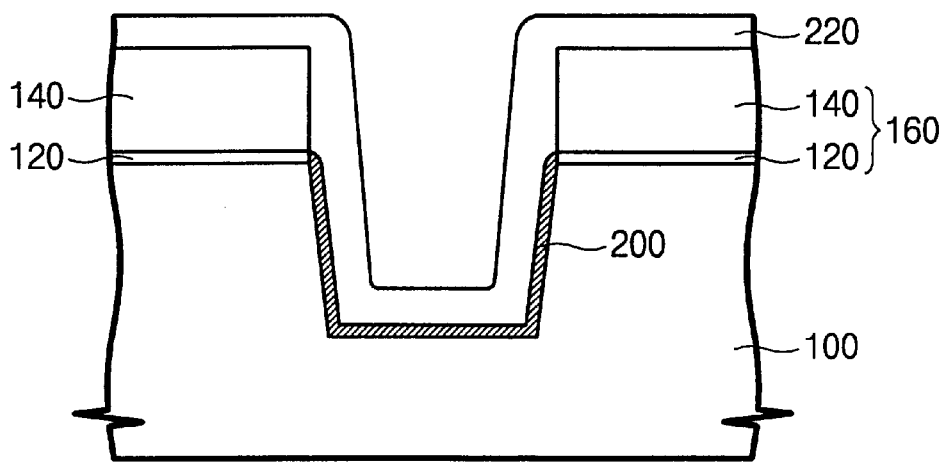
FIGS. 12 through 16 are partial cross-sectional views showing the steps of forming trench isolation according to other embodiment of the present invention.

Referring to FIG. 12, a semiconductor substrate 100 is etched using a trench etch mask 160 to form a trench therein. Then, a first thermal oxidation process is performed to repair the etch damage resulting from etching the trench. Thus, the first thermal oxide layer 200 is formed on a surface of the trench. Next, a material having an etch selectivity with respect to the mask nitride layer 140 of the trench etch mask 160, preferably a silicon oxide layer 220, is formed.

Figure 13:
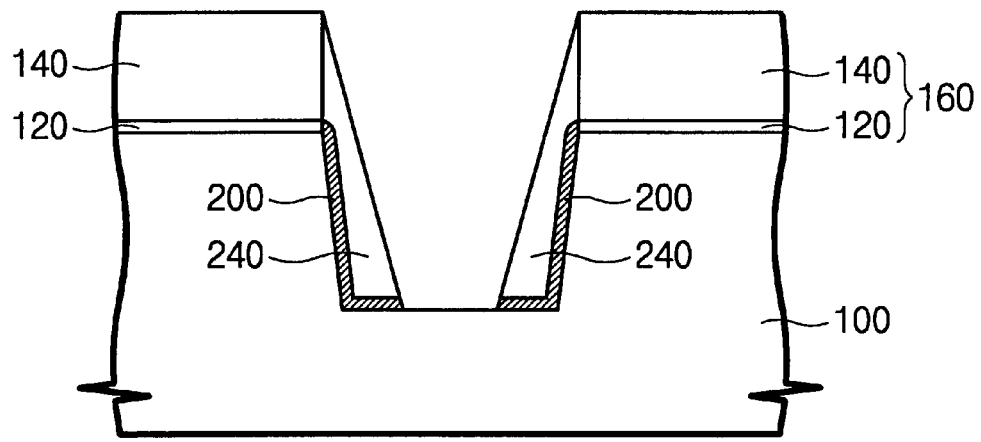

Referring to FIG. 13, the silicon oxide layer 220 is etched anisotropically to form the sidewall spacer 240 on the sidewalls of the trench and the trench etch mask 160. At this time, the etch process for forming the spacer exposes the semiconductor substrate 100 of the bottom of the trench. But a spacer etch process can be stopped on the thermal oxide layer 200 without exposing the semiconductor substrate 100 at the bottom of the trench.

Figure 14:
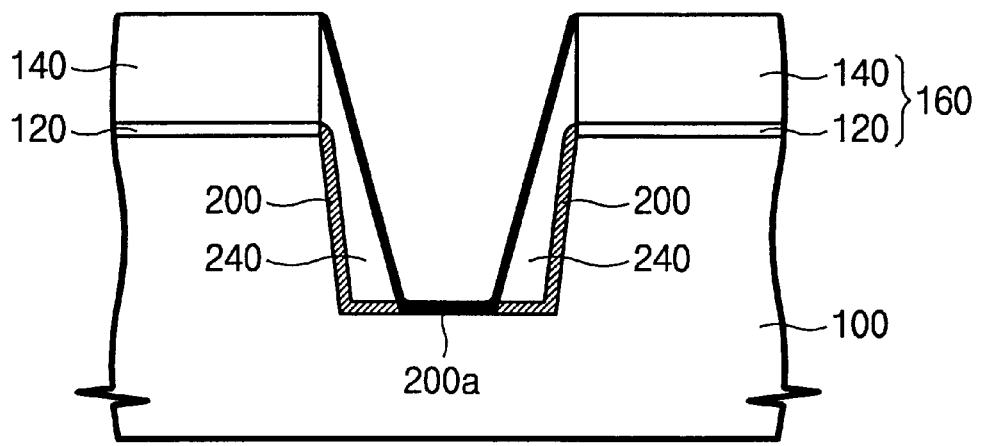

Referring to FIG. 14, a second thermal oxidation process is performed on the resulting structure where the sidewall spacer 240 is formed. At this time, the second thermal oxide layer 200a is formed on the semiconductor substrate 100 of the exposed trench bottom. Also, the second thermal oxide layer 200a can be formed on the silicon oxide sidewall spacer 240. Similar to the above-mentioned embodiment, a thermal oxide layer can be formed at the interface between the first thermal oxide layer 200 and the semiconductor substrate 100. Also the first thermal oxidation process can be omitted.

Figure 15:
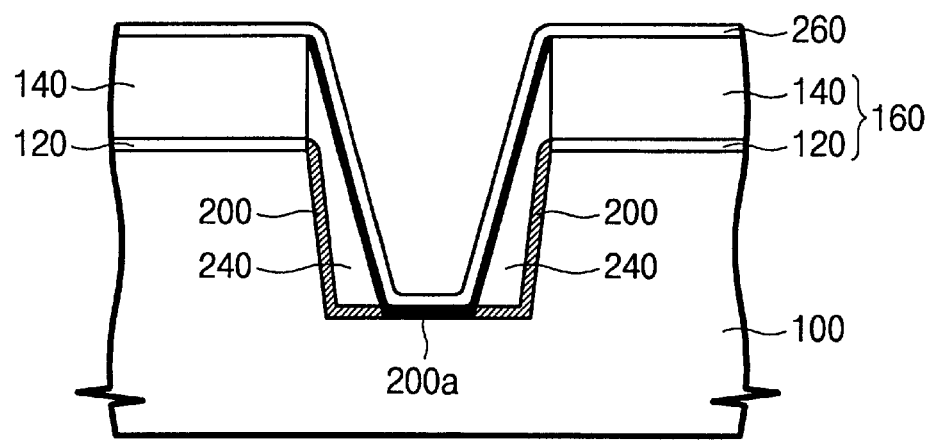
Figure 16:
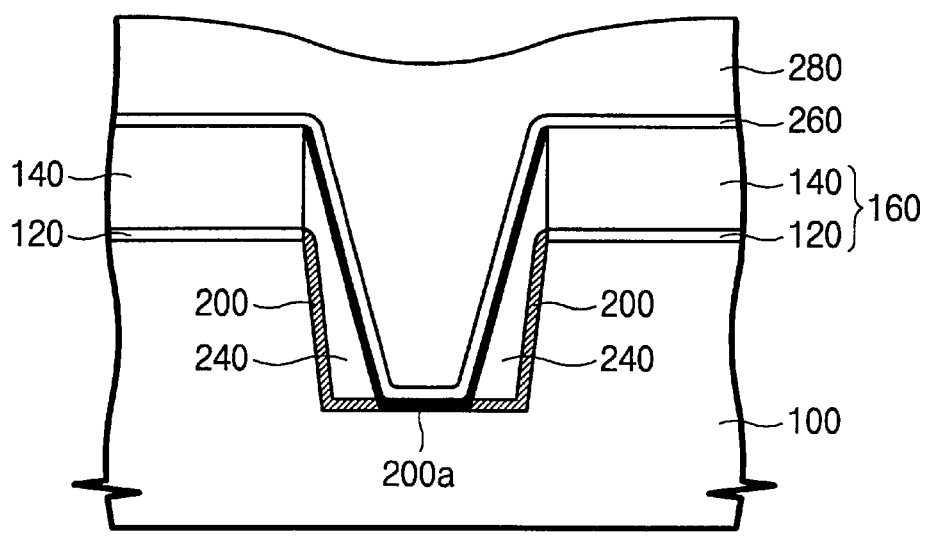

Referring to FIG. 15, a nitride liner 260 is formed on the second thermal oxide layer 200a, and a trench isolation material 280 is formed on the nitride liner 260 to fill the trench as illustrated in FIG. 16.

Subsequentially, the trench isolation material 280 is planarized using the mask nitride layer 140 as a planarization stop layer. A phosphoric acid solution is used to remove the mask nitride layer 140. At this time, because the nitride liner 260 is protected by the silicon oxide sidewall spacer 240 and the second thermal oxide layer 200a, the formation of a dent in the nitride liner 260 can be prevented.

Subsequently, a conventional CMOS process is performed.

Therefore, according to an embodiment of the present invention, an insulation layer spacer having an etch sensitivity with respect to a mask nitride layer is formed after forming a trench and before forming a nitride liner. The nitride liner is protected by the insulation spacer in the process of removing the mask nitride layer. Thus, it is possible to form good trench isolation without a dent.

While the invention has been particularly shown and described with reference to the preferred embodiments and the experiment thereof, it will be understood by those skilled in the art that various changes in form and details may be made without departing from the spirit and scope of the invention.

What is claimed is:

1. A method for forming an isolation trench in a semiconductor substrate, comprising:
    forming a trench etch mask pattern on a semiconductor substrate, the trench etch mask pattern including a pad oxide layer and a mask nitride layer;
    etching the semiconductor substrate to form a trench therein using the trench etch mask pattern;
    forming a spacer insulation layer over the trench;
    anisotropically etching the spacer insulation layer to form sidewall spacers on sidewalls of the mask pattern and on sidewalls of the trench;
    after forming the sidewall spacers on the sidewalls of the mask pattern and on the sidewalls of the trench, forming a nitride liner over the sidewall spacers; and
    filling the trench with a trench isolation material.

2. The method of claim 1, further comprising:
    thermally oxidizing the semiconductor substrate before forming the nitride liner.

3. The method of claim 1, further comprising:
    planarizing the trench isolation material until the mask nitride layer is exposed; and
    removing the mask nitride layer.

4. The method of claim 1, wherein the trench etch mask pattern is laterally etched to a thickness of approximately 200 Å or less in a direction of the active region.

5. The method of claim 4, further comprising performing a thermal oxidation process after forming the trench and before forming the spacer insulation layer.

6. The method of claim 4, further comprising performing a thermal oxidation process before forming the sidewall spacers.

7. The method of claim 1, further comprising performing a thermal oxidation process before forming the spacer insulation layer.

8. The method of claim 1, further comprising performing a thermal oxidation process after forming the spacer insulation layer and before forming the sidewall spacers.

9. The method of claim 1, wherein the spacer insulation layer is made of a material having an etch selectivity with respect to the mask nitride layer.

10. The method of claim 1, wherein the spacer insulation layer is made of silicon oxide through a chemical vapor deposition (CVD) technique to a thickness of approximately 50 Å to 1000 Å.

11. The method of claim 10, further comprising forming a thermal oxide layer on the sidewalls and a bottom of the trench and on the sidewall spacers.

12. A method for forming trench isolation of a semiconductor device, the method comprising:
    forming a trench etch mask pattern on a semiconductor substrate to define an active region, the trench etch mask pattern including a pad oxide layer and a nitride layer;
    etching the semiconductor substrate to form a Wench therein using the mask pattern;
    after forming the trench in the substrate, laterally etching the mask pattern in a direction of the active region;
    forming an oxide layer over the trench and the laterally-etched mask pattern;
    anisotropically etching the oxide layer to form sidewall spacers on sidewalls of the mask pattern and on sidewalls of the trench;
    forming a nitride liner overlying the sidewall spacers; and
    forming a trench isolation material on the nitride liner to fill the trench.

13. The method of claim 12, further comprising:
    performing a thermal oxidation process to remove etch damage after etching the semiconductor substrate to form a trench therein.

14. The method of claim 13, wherein a thermal oxide layer having a thickness of approximately 50 Å to 300 Å is formed on the sidewalls of the trench and a bottom of the trench during the thermal oxidation process.

15. The method of claim 12, further comprising:
    planarizing the trench isolation material until the top of the mask nitride layer is exposed; and
    removing the mask nitride layer.

16. The method of claim 12, wherein the oxide layer is formed to a thickness of approximately 50 Å to 100 Å.

17. The method of claim 12, further comprising
    performing another thermal oxidation process to remove etch damage after forming the sidewall spacers.

18. The method of claim 17, wherein performing another thermal oxidation process after forming the sidewall spacers comprises forming a thermal oxide layer on the silicon oxide sidewall spacers.

19. The method of claim 12, wherein the bottom of the trench in the semiconductor substrate is exposed during the anisotropic etching of the oxide layer to form the sidewall spacers, further comprising:
    forming a thermal oxide layer on the bottom of the trench by thermal oxidation after forming the sidewall spacers.

20. The method of claim 12, wherein the trench etch mask pattern is laterally etched to a width of approximately 200 Å in a direction of the active region.

21. The method of claim 12, wherein the sidewall spacer formed on the mask pattern and the sidewall spacer formed on the trench are separated from each other.

* * * * *

UNITED STATES PATENT AND TRADEMARK OFFICE
CERTIFICATE OF CORRECTION

PATENT NO. : 6,544,861 B2
DATED : April 8, 2003
INVENTOR(S) : Joon-Yong Joo

It is certified that error appears in the above-identified patent and that said Letters Patent is hereby corrected as shown below:

Column 8,
Line 11, "to form a Wench" should read -- to form a trench --

Signed and Sealed this

Second Day of September, 2003

JAMES E. ROGAN
*Director of the United States Patent and Trademark Office*